United States Patent
Pavier et al.

(10) Patent No.: US 6,717,260 B2
(45) Date of Patent: Apr. 6, 2004

(54) CLIP-TYPE LEAD FRAME FOR SOURCE MOUNTED DIE

(75) Inventors: Mark Pavier, Guilford (GB); Tim Sammon, Helensburgh (GB); Rachel Anderson, Battersea (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/045,809

(22) Filed: Jan. 11, 2002

(65) Prior Publication Data

US 2002/0096749 A1 Jul. 25, 2002

Related U.S. Application Data

(60) Provisional application No. 60/263,137, filed on Jan. 22, 2001.

(51) Int. Cl.[7] ............................................... H01L 23/34
(52) U.S. Cl. ........................ 257/728; 257/776; 257/676
(58) Field of Search ................................ 257/728, 776, 257/692, 676

(56) References Cited

U.S. PATENT DOCUMENTS

| | | | |
|---|---|---|---|
| 3,902,189 A | | 8/1975 | Simpson |
| 4,862,245 A | | 8/1989 | Pashby et al. |
| 5,365,106 A | | 11/1994 | Watanabe |
| 5,535,509 A | | 7/1996 | Tomita et al. |
| 5,637,922 A | * | 6/1997 | Fillion et al. ............... 257/728 |
| 5,796,162 A | | 8/1998 | Huang |
| 5,883,424 A | | 3/1999 | Tanaka |
| 5,929,514 A | | 7/1999 | Yalamanchili |
| 6,249,041 B1 | * | 6/2001 | Kasem et al. ............... 257/666 |
| 6,459,147 B1 | * | 10/2002 | Crowley et al. ............. 257/692 |

* cited by examiner

Primary Examiner—Phat X. Cao
(74) Attorney, Agent, or Firm—Ostrolenk, Faber, Gerb & Soffen, LLP

(57) ABSTRACT

A semiconductor package includes a lead frame having a displaced integral strap which is cupped out of a lead frame plane to provide a nest that receives a semiconductor chip electrically connected to an inner surface of the cupped strap. The semiconductor package further has a housing molded over and encapsulating the semiconductor chip with the frame such that a surface of the semiconductor chip facing away from the cupped strip is flush with or protrudes beyond a bottom of the housing.

17 Claims, 3 Drawing Sheets

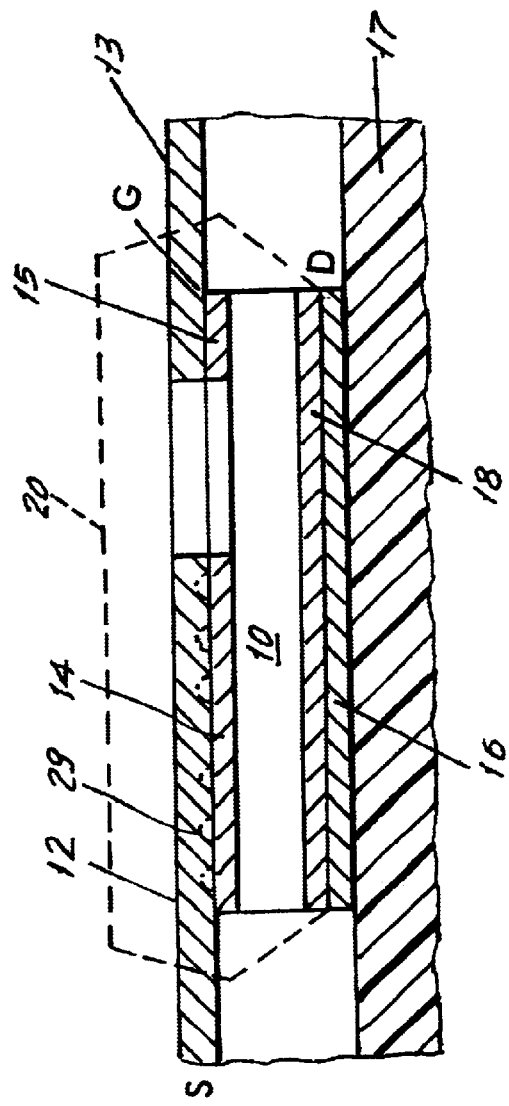
FIG. 1
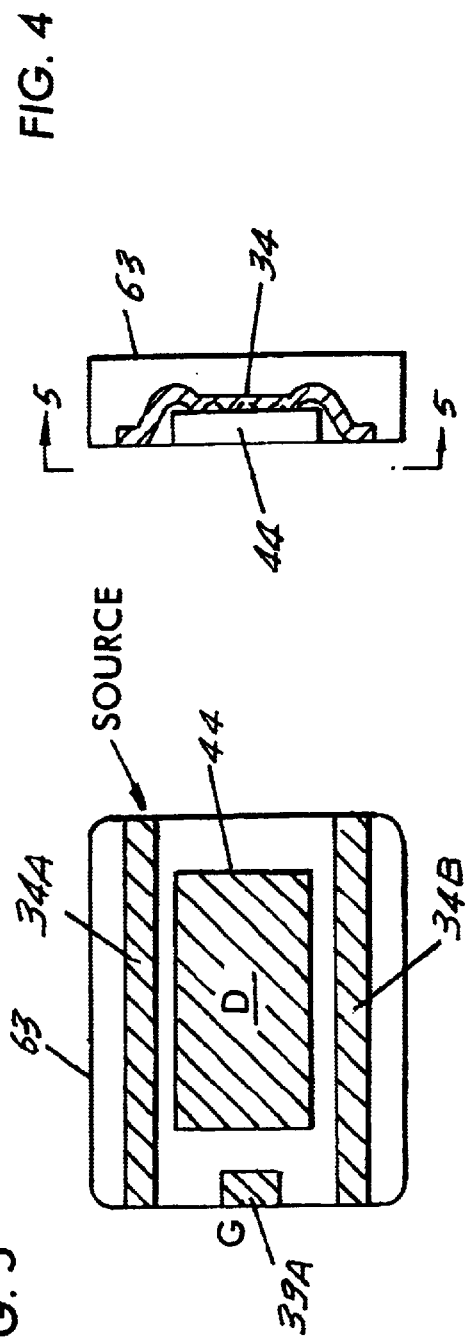
FIG. 4
FIG. 5

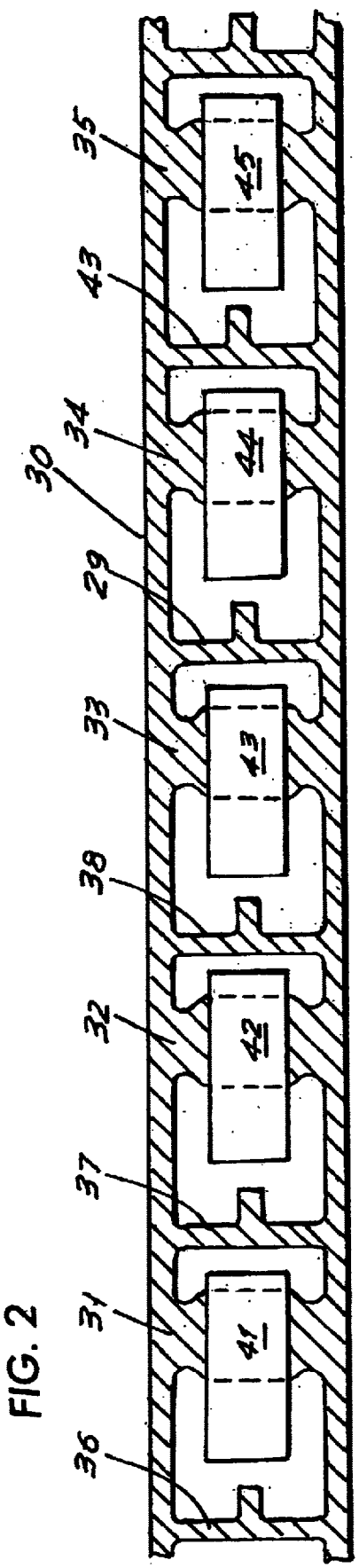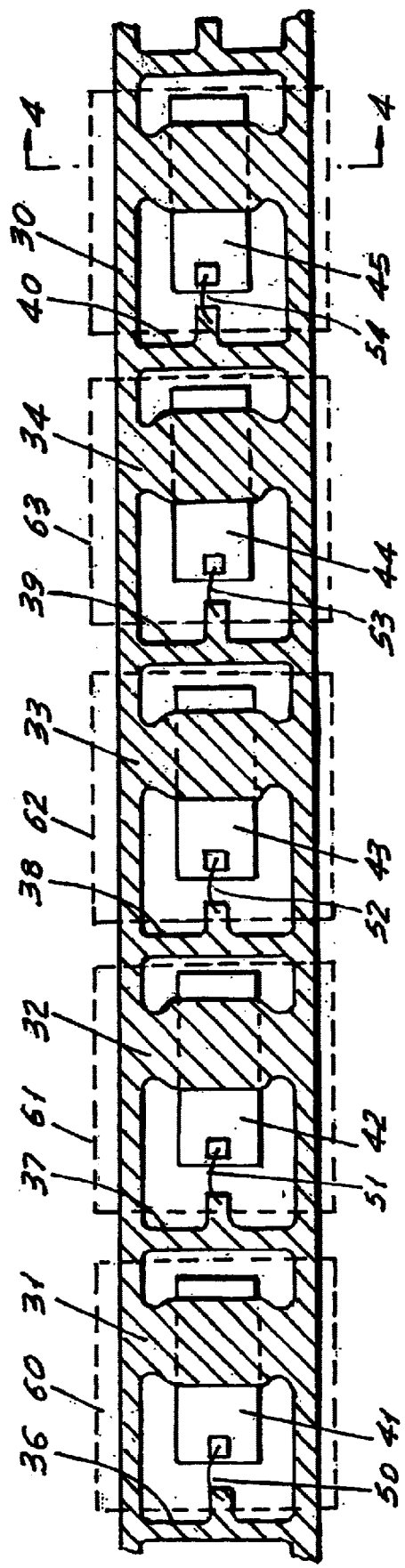
FIG. 2
FIG 3

CLIP-TYPE LEAD FRAME FOR SOURCE MOUNTED DIE

CROSS REFERENCE TO RELATED APPLICATION

This application is based on and claims priority to U.S. Provisional Patent Application No. 60/263,137, filed Jan. 22, 2001, the entire disclosure of which is hereby incorporated by reference.

FIELD OF THE INVENTION

This invention relates to semiconductor device packages or housings and more specifically relates to a novel clip-type lead frame for a semiconductor device.

BACKGROUND OF THE INVENTION

Semiconductor devices, particularly power MOSFETs are frequently mounted on a conductive lead frame which is overmolded with an insulation housing. Leads extend from the lead frame through the housing for external connection to electrical circuits.

Advances in semiconductor processing technology, however, have made the parasitics associated with conventional packages more of a performance limiting factor. This is particularly true in the case of power switching devices where, as in the case of power MOSFETs, the on-resistance of these devices continues to push the lower limits. Thus, the parasitic resistance introduced by the lead frame in conventional packages becomes much more significant for very high current devices such as power MOSFETs.

It would be very desirable to provide a very thin (low profile) surface mount package which lends itself to low cost manufacture, and which reduces the area (or foot print) of the lead frame and which has excellent thermal and electrical properties and which reduces lead frame scrap.

BRIEF DESCRIPTION OF THE INVENTION

In accordance with the invention, a novel lead frame is provided for a small volume package, for example, and SO8 type package, that has a central strip which is upwardly displaced out of the plane of the lead frame for receiving the source electrode surface, or other power electrode of a semiconductor die. The die is then nested within the lead frame with its top surface against the bottom of the displaced central source strap. The bottom of the die, and thus the drain electrode of a power MOSFET die protrudes from the bottom surface of a plastic housing which encapsulates the die and lead frame.

The resulting device is a surface mountable device which can be made with inexpensive and reliable techniques and has excellent thermal and electrical properties. The device can be easily bonded to support surfaces and is an ultra thin package. The footprint area occupied by a chip scale package is typically less than or equal to 1.5 times that of the die area contained within the package (taken from IPC CSP definition). Alternatively, in certain cases the package size is chip scale, that is, the package area is approximately equal to the die area, and precious metal use and waste material is reduced. Finally, the novel device has very good thermal and electrical properties with reduced parasites.

BRIEF DESCRIPTION OF THE DRAWINGS

FIG. 1 is a schematic cross-section of a first embodiment of the assembled package of the invention mounted on a support.

FIG. 2 is a top view of the bottom surface of a lead frame of the invention with die located thereon and atop the source strap sections.

FIG. 3 is a view of the opposite side of the lead frame of FIG. 2 and shows wire bonding and, in dotted lines, package encapsulation in plastic housing segments.

FIG. 4 is a cross-section of FIG. 3 taken across section line 4—4 in FIG. 3.

FIG. 5 is a bottom view of the housing of FIG. 4 as seen from line 5—5 in FIG. 4.

DETAILED DESCRIPTION OF EMBODIMENTS OF THE INVENTION

Figure 6:
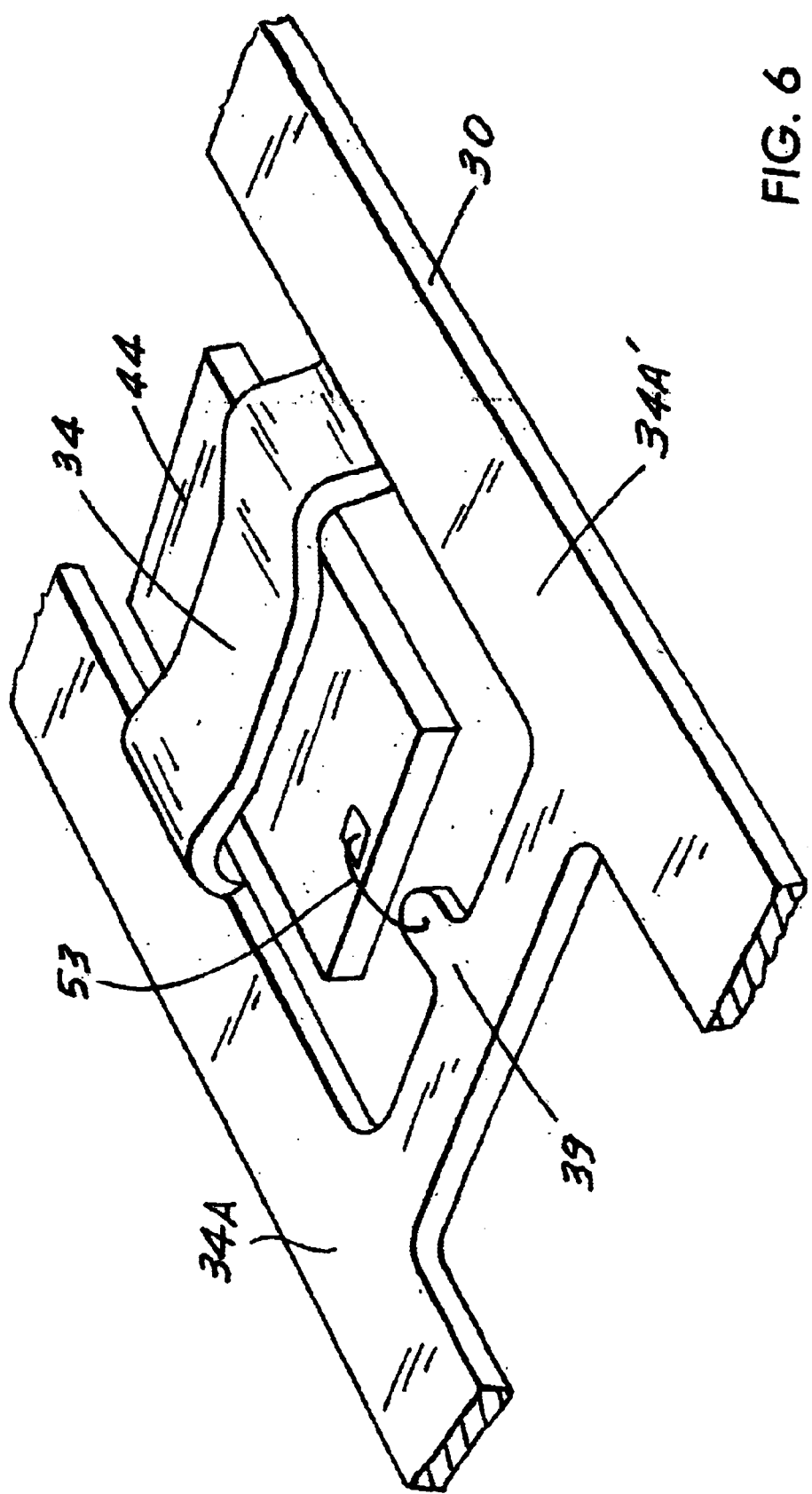
FIG. 6 is a perspective view of a single die which is mounted in a clip as in FIG. 3.

FIG. 1 shows one embodiment of a housing of the invention in which a semiconductor die 10 has a bottom power electrode such as a MOSFET drain (not shown) and a top power electrode such as a source electrode of a MOSFET on its opposite surface (not shown). The source and gate electrodes are connected to lead frame elements 12 and 13 as by a solder or conductive epoxy or by a polyamide adhesive tapes 14 and 15 respectively. If the source electrode is to be soldered to lead frame, it is possible to use solder-bump technology by providing an arrangement of solder bumps 29 either on the source electrode or an inner surface of the frame element 12. The bottom power electrode (or drain of a MOSFET) may be soldered or otherwise affixed to conductive trace 16 on printed circuit board 17 by a solder 18 or the like. A molded housing 20, shown in dotted lines is molded over and encapsulates the die 10 and its related lead frame elements. Significantly, the bottom of die 10 protrudes through and beyond the bottom of housing 20 so that it can be conveniently connected by solder or conductive epoxy, or the like to the printed circuit board 17.

FIGS. 2–6 show a novel lead frame 30, shaded in FIGS. 2 and 3 to conveniently show the lead frame area remaining after stamping. Lead frame 30 has a plurality of novel and identical repeating structures in a conventional thin copper or a copper alloy strip. Thus, each section has a lateral source-receiving strap 31 to 35 respectively, and a lateral gate electrode strap 36 to 40 respectively. The source strap segments 31 to 35 are cupped out of the plane of lead frame 30 as best seen in FIGS. 4 and 6 to provide a "nest" for respective MOSFET die 41 to 45 (FIG. 2). To assemble the novel package, die 41 to 45 are first mounted with their top electrode surfaces (source electrodes in a MOSFET) electrically connected to the "interior" surface of straps 32 to 35 respectively as by soldering or by a conductive epoxy or the like, as shown in FIG. 2. Thereafter, the lead frame 30 is inverted as shown in FIG. 3 and wire bonds 50 to 53 are made from the top gate electrode of each of die 41 to 44 to the protrusions from gate electrode straps 36 to 39 respectively.

The individual lead frame segments with respective die are then overmolded with conventional plastic mold compound as shown by dotted lines 60 to 63 in FIG. 3. The molded lead frame is then deflashed and singulated (along the vertical dotted lines of the packages in FIG. 3) producing individual housings of the appearance of FIGS. 4 and 5.

Note that the bottom of die 44 the lead frame rails 34A and 34B, and the protrusion 39A of gate strap 39 are flush with coplanar, or protrude beyond the bottom of the housing 63 (FIGS. 4 and 5) to permit access to all electrodes of the device on one surface for simplified surface mounting to a printed circuit board. Further note that rails 34A and 34B of the strip 34 can be continuous or segmented.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package comprising:
   a semiconductor die having a control electrode and a first power electrode on a first major surface thereof, and a second power electrode on a second major surface thereof opposite the first major surface;
   a lead frame including a control lead, and a strap portion electrically connected to the first power electrode and terminating at a first power lead; and
   a molded housing, wherein the control lead and the first power lead are coplanar and are exposed through a major surface of the molded housing, and wherein the second power electrode is electrically connected through the major surface of the molded housing.

2. The semiconductor package defined in claim 1, wherein the lead frame extends along a longitudinal axis and has two laterally spaced rails bridged by the strap.

3. The semiconductor package defined in claim 1, wherein the semiconductor die is a MOSFET whose one surface has a source electrode attached to the inner surface of the strap, and the other surface of the silicon die has a drain electrode attachable to a printed circuit board.

4. The semiconductor package defined in claim 3, further comprising solder bumps, which are distributed across either the top side electrode or the inner surface of the strap, for soldering the source electrode to the strap.

5. The semiconductor package defined in claim 3, further comprising conductive epoxy between the source electrode and the inner surface of the strap to provide electric contact therebetween.

6. The semiconductor package defined in claim 3, further comprising a polyamide tape having adhesive opposite surfaces which are attached to the source electrode and to the inner surface of the strap, respectively.

7. The semiconductor package device defined in claim 1, further comprising an least one other strap displaced out of the plane of the lead frame.

8. The semiconductor package device defined in claim 1, wherein the other surface of the semiconductor die extends so that it at least terminates in the same plane as a bottom surface of the housing.

9. A lead frame for a semiconductor die, the lead frame lying in a plane and having a plurality of coplanar sides, which define a nest sized to receive the semiconductor die, and a strap displaced out of the plane of the lead frame and extending across the nest to bridge two coplanar sides for positioning the semiconductor die in the nest so that a bottom surface of the semiconductor die, which faces away from the strap, is exposed for surface mounting connection; wherein the coplanar sides of the lead frame have respective bottom surfaces which are coplanar with the bottom surface of the semiconductor die; further having a housing molded over and protecting the lead frame and the semiconductor die; the bottom surfaces of the coplanar sides and of the semiconductor die being flush with or extend beyond a bottom surface of the housing.

10. A semiconductor package comprising:
    a semiconductor die including a first power terminal disposed on a first major surface thereof and a second power terminal disposed on a second major surface thereof;
    a conductive strap including a first portion electrically connected to said first power terminal and extending between at least said first power terminal and said second power terminal and terminating at a first external power lead;
    a molded housing in which said die is disposed, and including a common major surface opposite said first major surface of said die; wherein said first external power lead is exposed through said common major surface, and said second power terminal is electrically connectable through said common major surface.

11. A semiconductor package according to claim 10, wherein said die includes a control terminal, and further comprising a control lead electrically connected to a control terminal, said control lead being exposed through said common major surface of said molded housing.

12. A semiconductor package according to claim 11, wherein said control terminal is electrically connected to said control lead by a wire bond.

13. A semiconductor package according to claim 10, wherein said second power terminal and said first external power lead are coplanar.

14. A semiconductor package according to claim 10, wherein said conductive strap includes a second portion connected to said first portion and extending between at least said first power terminal and said second power terminal and terminating at a second external power lead.

15. A semiconductor package according to claim 10, wherein said second external power lead is disposed on a side of said die opposite said first external power lead, whereby said strap is formed in a shape of a cup.

16. A semiconductor package according to claim 10, wherein said die is a MOSFET in which said first power terminal is a source terminal and said second power terminal is a drain terminal.

17. A semiconductor package according to claim 16, wherein said die further includes a gate terminal electrically connected to an external gate lead by a wire bond, said external gate lead being exposed through said common major surface of said molded housing.

* * * * *